(12) United States Patent
Kim et al.

(10) Patent No.: US 12,489,068 B2
(45) Date of Patent: Dec. 2, 2025

(54) REDISTRIBUTION SUBSTRATE HAVING EMBEDDED INDUCTOR

(71) Applicant: SAMSUNG ELECTRONICS CO., LTD., Suwon-si (KR)

(72) Inventors: So-Young Kim, Suwon-si (KR); Giwon Kim, Changwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 826 days.

(21) Appl. No.: 17/827,063

(22) Filed: May 27, 2022

(65) Prior Publication Data
US 2023/0118422 A1  Apr. 20, 2023

(30) Foreign Application Priority Data
Oct. 15, 2021  (KR) .................. 10-2021-0137826

(51) Int. Cl.
*H01L 23/64* (2006.01)
*H01F 17/00* (2006.01)
*H01L 23/00* (2006.01)
*H01L 23/31* (2006.01)
*H01L 23/498* (2006.01)
*H01L 25/10* (2006.01)

(52) U.S. Cl.
CPC ....... *H01L 23/645* (2013.01); *H01F 17/0013* (2013.01); *H01L 25/105* (2013.01); *H01F 2017/004* (2013.01); *H01L 23/3128* (2013.01); *H01L 23/49816* (2013.01); *H01L 23/49822* (2013.01); *H01L 24/16* (2013.01); *H01L 2225/1023* (2013.01); *H01L 2225/1041* (2013.01); *H01L 2225/1058* (2013.01)

(58) Field of Classification Search
CPC ..... H01L 23/498–49894; H01L 23/538–5389; H01L 23/645; H01F 17/00–17/08
See application file for complete search history.

(56) References Cited

U.S. PATENT DOCUMENTS

| | | |
|---|---|---|
| 7,170,384 B2 | 1/2007 | Kim et al. |
| 8,686,821 B2 | 4/2014 | Chang et al. |
| 8,907,448 B2 | 12/2014 | Chen |

(Continued)

FOREIGN PATENT DOCUMENTS

| | | |
|---|---|---|
| KR | 10-2015-0115867 A | 10/2015 |
| KR | 10-2021-0032353 A | 3/2021 |

*Primary Examiner* — Kevin Parendo
(74) *Attorney, Agent, or Firm* — Fish & Richardson P.C.

(57) ABSTRACT

Disclosed are redistribution substrates and semiconductor packages including the same. The semiconductor package comprises a redistribution substrate, a semiconductor chip mounted on the redistribution substrate, and an inductor structure in the redistribution substrate and electrically connected to the semiconductor chip. The inductor structure includes an outer coil pattern including a plurality of vertical parts and a horizontal part that connects the plurality of vertical parts to each other, and an inner coil pattern between the vertical parts and electrically connected to the outer coil pattern. The horizontal part includes a first conductive layer, and a second conductive layer between the first conductive layer and the inner coil pattern. The second conductive layer has a thickness that is less than a thickness of the first conductive layer.

20 Claims, 15 Drawing Sheets

(56) References Cited

U.S. PATENT DOCUMENTS

| | | | |
|---|---|---|---|
| 9,209,131 B2 | 12/2015 | Gu et al. | |
| 9,466,659 B2 | 10/2016 | England et al. | |
| 9,496,213 B2 | 11/2016 | Kidwell, Jr. et al. | |
| 9,666,362 B2 | 5/2017 | Berdy et al. | |
| 9,853,003 B1* | 12/2017 | Han | H01L 23/645 |
| 10,049,815 B2 | 8/2018 | Kim et al. | |
| 10,115,661 B2 | 10/2018 | Doyle et al. | |
| 2005/0052268 A1* | 3/2005 | Pleskach | H01L 23/49822 |
| | | | 336/200 |
| 2007/0090911 A1* | 4/2007 | Lee | H01L 23/49838 |
| | | | 336/200 |
| 2011/0133877 A1 | 6/2011 | Chiu et al. | |
| 2014/0264734 A1* | 9/2014 | Luo | H01L 23/5384 |
| | | | 336/200 |
| 2014/0374875 A1* | 12/2014 | Yen | H10D 1/20 |
| | | | 257/531 |
| 2017/0345754 A1* | 11/2017 | Yun | H01L 23/5227 |
| 2018/0190584 A1* | 7/2018 | Upadhyaya | H10D 1/20 |
| 2019/0103370 A1* | 4/2019 | Huang | H01L 25/105 |
| 2019/0164681 A1* | 5/2019 | Kidwell, Jr. | H01F 17/0033 |
| 2019/0385775 A1* | 12/2019 | Roth | H01L 24/97 |
| 2020/0286660 A1* | 9/2020 | Kamgaing | H01L 24/16 |
| 2020/0312795 A1* | 10/2020 | McDonald | H10D 1/20 |

* cited by examiner

REDISTRIBUTION SUBSTRATE HAVING EMBEDDED INDUCTOR

CROSS-REFERENCE TO RELATED APPLICATION

This U.S. non-provisional application claims priority under 35 U.S.C § 119 to Korean Patent Application No. 10-2021-0137826 filed on Oct. 15, 2021, in the Korean Intellectual Property Office, the disclosure of which is hereby incorporated by reference in its entirety.

BACKGROUND

The present disclosure relates to a redistribution substrate and a semiconductor package including the same, and more particularly, to a redistribution substrate including an inductor and a semiconductor package including the same.

A semiconductor package is provided to implement an integrated circuit chip for use in electronic products. A semiconductor package is typically configured such that a semiconductor chip is mounted on a printed circuit board and bonding wires or bumps are used to electrically connect the semiconductor chip to the printed circuit board. With the growth of the of electronic industry, various efforts have been conducted to improve the reliability and resiliency of semiconductor packages.

SUMMARY

Some exemplary embodiments of the present disclosure provide a redistribution substrate with improved electrical properties and increased reliability and a semiconductor package including the same.

According to some exemplary embodiments of the present disclosure, a semiconductor package may comprise: a redistribution substrate; a semiconductor chip mounted on the redistribution substrate; and an inductor structure in the redistribution substrate that is electrically connected to the semiconductor chip. The inductor structure may include: an outer coil pattern that includes a plurality of vertical parts and a horizontal part connecting the plurality of vertical parts to each other; and an inner coil pattern between the vertical parts and electrically connected to the outer coil pattern. The horizontal part may include: a first conductive layer; and a second conductive layer between the first conductive layer and the inner coil pattern. The second conductive layer may have a thickness that is less than a thickness of the first conductive layer.

According to some exemplary embodiments of the present disclosure, a semiconductor package may comprise: a redistribution substrate; a semiconductor chip mounted on the redistribution substrate; and an inductor structure in the redistribution substrate that is electrically connected to the semiconductor chip. The inductor structure may include: an inner coil pattern; and an outer coil pattern that surrounds the inner coil pattern. The outer coil pattern may include: a first conductive layer; and a second conductive layer between the first conductive layer and the inner coil pattern. A distance between the first conductive layer and the second conductive layer may be less than a thickness of the first conductive layer.

According to some exemplary embodiments of the present disclosure, a redistribution substrate may comprise: a dielectric pattern that has a first surface and a second surface being opposite to each other; a first pad on the first surface; a second pad on the second surface; a redistribution pattern that connects the first pad to the second pad; and an inductor structure between the first surface and the second surface, the inductor structure being electrically connected to at least one of the first pad and the second pad. The inductor structure may include: an inner coil pattern that includes a plurality of inner horizontal parts and a plurality of inner vertical parts connecting the inner horizontal parts to each other; and an outer coil pattern that surrounds the inner coil pattern and includes a plurality of outer horizontal parts and a plurality of outer vertical parts connecting the outer horizontal parts to each other. Each of the outer horizontal parts may include: a first conductive layer; and a second conductive layer that has a thickness that is less than a thickness of the first conductive layer.

DETAILED DESCRIPTION OF THE PREFERRED EMBODIMENTS

Figure 1:
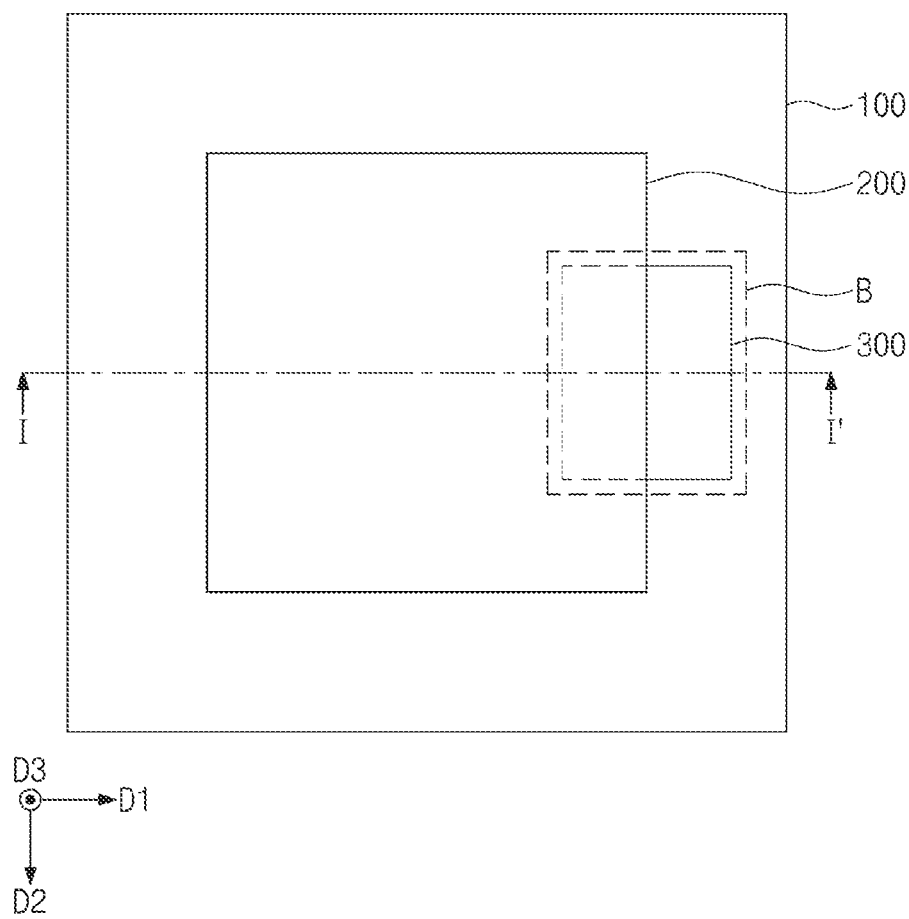
FIG. 1 illustrates a plan view showing a semiconductor package according to some exemplary embodiments of the present disclosure.

In this description, like reference numerals may indicate like components. The following will describe a redistribution substrate and a semiconductor package including the same according to some exemplary embodiments of the present disclosure.

Figure 2:
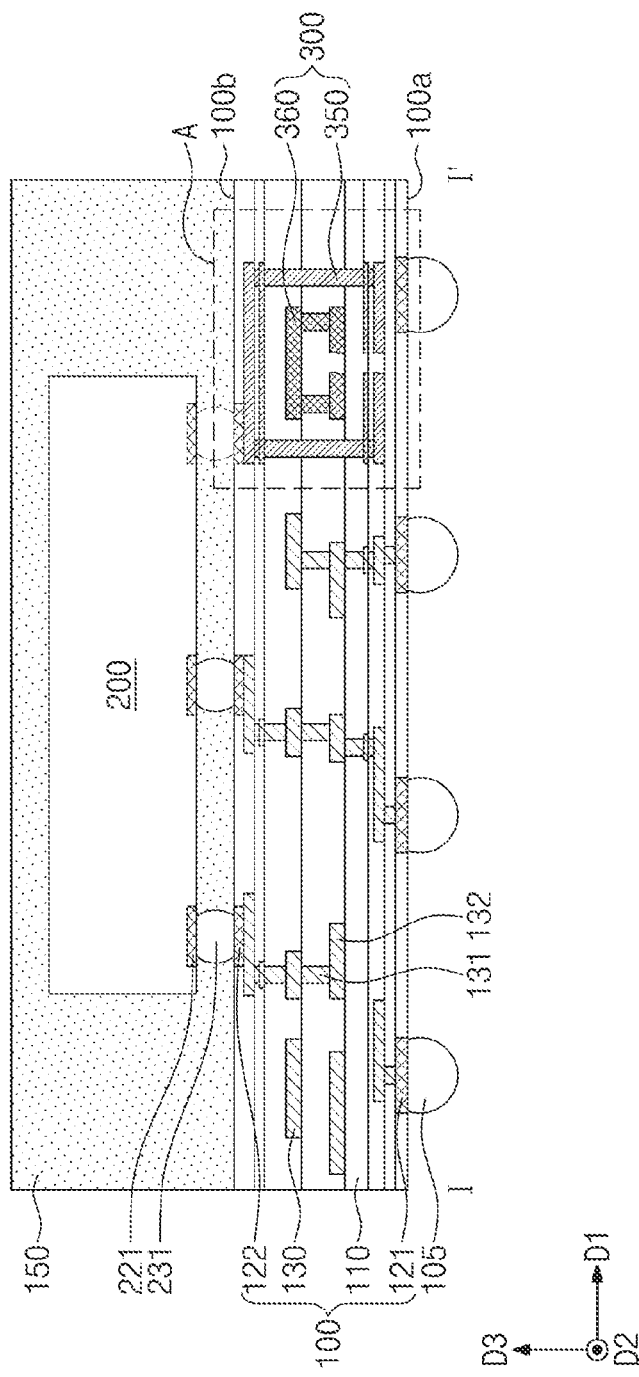
FIG. 2 illustrates a cross-sectional view taken along line I-I' of FIG. 1.

FIG. 1 illustrates a plan view showing a semiconductor package according to some exemplary embodiments of the present disclosure. FIG. 2 illustrates a cross-sectional view taken along line I-I' of FIG. 1.

Referring to FIGS. 1 and 2, a semiconductor package may include a redistribution substrate 100, a semiconductor chip 200, external bonding terminals 105, connection terminals 231, and a molding layer 150. The semiconductor package may be, for example, a fan-out semiconductor package.

The redistribution substrate 100 may have a first surface 100a on which the external bonding terminals 105 are disposed and a second surface 100b on which the semiconductor chip 200 is mounted. The external bonding terminals 105 may connect the semiconductor package to external devices. Each of the first surface 100a and the second surface 100b may be parallel to a first direction D1 and a second direction D2. The first surface 100a and the second surface 100b may be spaced apart from each other in a third direction D3. The redistribution substrate 100 may include dielectric patterns 110, first pads 121, second pads 122, redistribution patterns 130, and an inductor structure 300.

The dielectric pattern 110 may include an inorganic material, such as silicon oxide (SiOx), silicon nitride (SiNx), or silicon oxynitride (SiON). The dielectric pattern 110 may include an organic material, such as a photo-imagable dielectric (PID) material. The photo-imagable dielectric material may be a polymer. The photo-imagable dielectric material may include, for example, at least one selected from photosensitive polyimide, polybenzoxazole, phenolic polymers, and benzocyclobutene polymers. The dielectric pattern 110 may have a multi-layered structure. For example, the redistribution substrate 100 may include a plurality of vertically stacked dielectric patterns 110. The number of stacked dielectric patterns 110 may be variously changed. The dielectric patterns 110 may each have a thickness that is changed based on position. According to some exemplary embodiments, the dielectric patterns 110 may include the same material as each other. According to some exemplary embodiments, no distinct interface may be provided between the dielectric patterns 110.

The first pads 121 may be provided on the first surface 100a of the redistribution substrate 100. The first pads 121 may be horizontally spaced apart from each other. The first pads 121 may be electrically separated from each other. The first pads 121 may have their bottom surfaces exposed on the first surface 100a that are not covered with the dielectric patterns 110. For example, the bottom surfaces of the first pads 121 may be coplanar with those of the dielectric patterns 110. According to some exemplary embodiments, the first pads 121 may be provided in a lowermost one of the dielectric pattern 110. The lowermost dielectric pattern 110 may cover lateral surfaces of the first pads 121. The first pads 121 may include a metallic material, such as copper. According to some exemplary embodiments, the lowermost dielectric pattern 110 may include a different material from that of other dielectric patterns 110. The lowermost dielectric pattern 110 may include, for example, a dielectric polymer.

The external bonding terminals 105 may be provided on the bottom surfaces of the first pads 121. The external bonding terminals 105 may include a conductive material, such as metal. The external bonding terminals 105 may include, for example, a solder ball or a solder bump. The first pads 121 may not be vertically aligned with chip pads 221 which will be discussed below. At least one of the first pads 121 may not vertically overlap the semiconductor chip 200. Therefore, the external bonding terminals 105 may increase the degree of freedom offered by the arrangement of components.

The second pads 122 may be formed on the second surface 100b of the redistribution substrate 100. The second pads 122 may be horizontally spaced apart from each other. The second pads 122 may be electrically separated from each other. The second pads 122 may include a metallic material, such as copper. The second pads 122 may have their top surfaces exposed on the second surface 100b which are not covered with the dielectric patterns 110. The second pads 122 may be provided in an uppermost one of the dielectric patterns 110. The uppermost dielectric pattern 110 may cover lateral surfaces of the second pads 122. According to some exemplary embodiments, the uppermost dielectric pattern 110 may include a different material from that of other dielectric patterns 110. The uppermost dielectric pattern 110 may include, for example, a dielectric polymer.

The redistribution patterns 130 may be provided in the dielectric patterns 110. The redistribution patterns 130 may electrically connect the first pads 121 to the second pads 122. The redistribution patterns 130 may include wire parts 132 that extend horizontally and via parts 131 that vertically connect the wire parts 132 to each other. The wire parts 132 may be correspondingly provided on top surfaces of the dielectric patterns 110. The via parts 131 may penetrate the dielectric patterns 110 and may be positioned between the wire parts 132. The redistribution patterns 130 may include a metallic material, such as copper.

The semiconductor chip 200 may be provided on the redistribution substrate 100. The semiconductor chip 200 may include a semiconductor substrate on which integrated circuits are fabricated, and may also include chip pads 221 electrically connected to the integrated circuits. The semiconductor chip 200 may have a bottom surface on which the chip pads 221 are formed, and may be mounted on the redistribution substrate 100 in order to allow the bottom surface to face the redistribution substrate 100. The semiconductor chip 200 may be, for example, a memory chip or a logic chip. The integrated circuits of the semiconductor chip 200 may include, for example, a memory circuit, a logic circuit, or a combination thereof. The integrated circuits may include transistors formed adjacent to the bottom surface of the semiconductor chip 200. The chip pads 221 may be provided on the bottom surface of the semiconductor chip 200. The chip pads 221 may include a metal, such as aluminum. The chip pads 221 may be electrically connected through wiring lines to the integrated circuits of the semiconductor chip 200. In this description, the phrase "electrically connected/coupled" may include "directly connected/coupled" or "indirectly connected/coupled through other conductive component(s)."

The connection terminal 231 may be formed to lie between and to electrically connect the second pad 122 and the chip pad 221. The semiconductor chip 200 may be electrically connected through the connection terminal 231 to the redistribution substrate 100. The connection terminal 231 may include at least one conductor structure selected from solders, pillars, and bumps. The connection terminal 231 may include a conductive material, such as metal.

The molding layer 150 may be provided on the redistribution substrate 100. The molding layer 150 may be formed on the second surface 100b of the redistribution substrate 100 to cover the semiconductor chip 200. The molding layer 150 may extend toward a gap between the semiconductor chip 200 and the redistribution substrate 100, thereby encapsulating the connection terminals 231. The molding layer 150 may include a dielectric polymer, such as an epoxy-based molding compound. According to some exemplary embodiments, an under-fill pattern (not shown) may be provided in a gap between the redistribution substrate 100 and the semiconductor chip 200.

Figure 3:
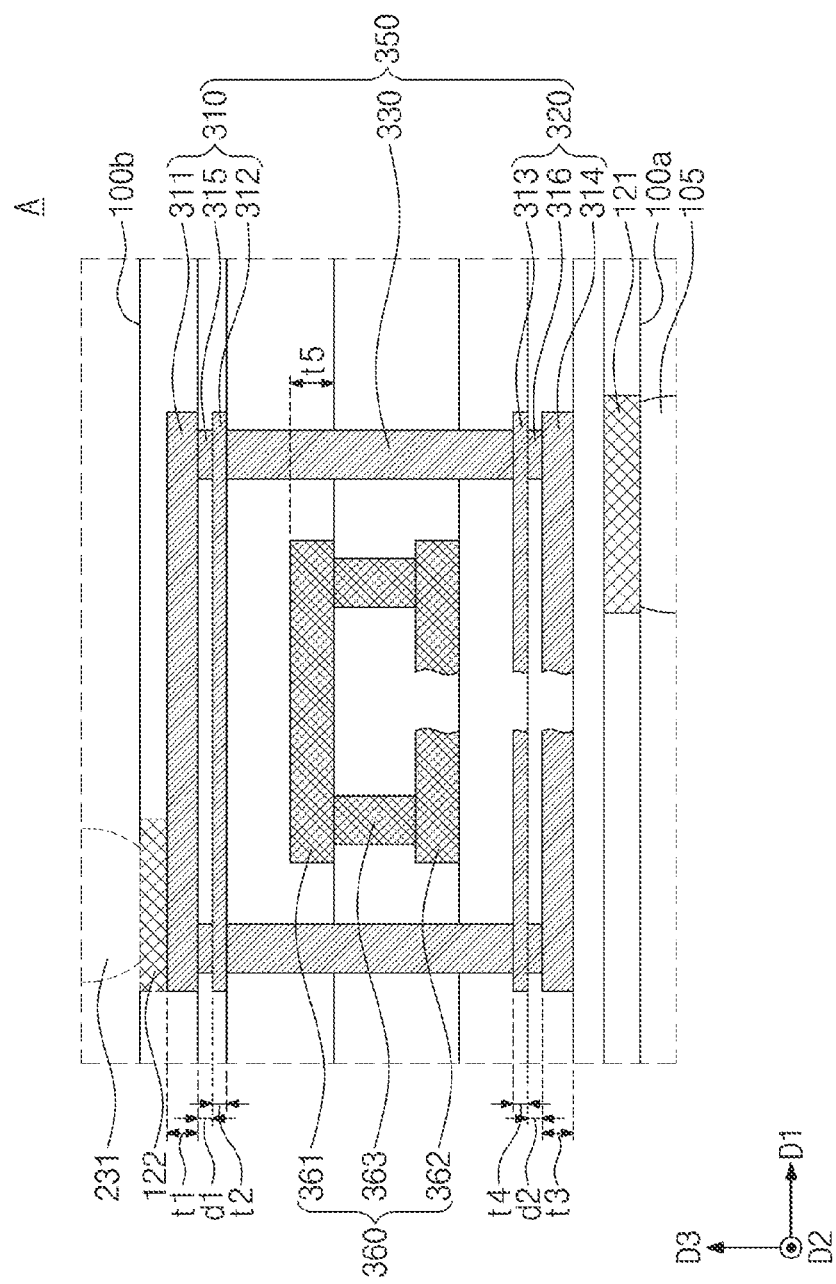
FIG. 3 illustrates an enlarged cross-sectional view showing section A of FIG. 2.
Figure 4:
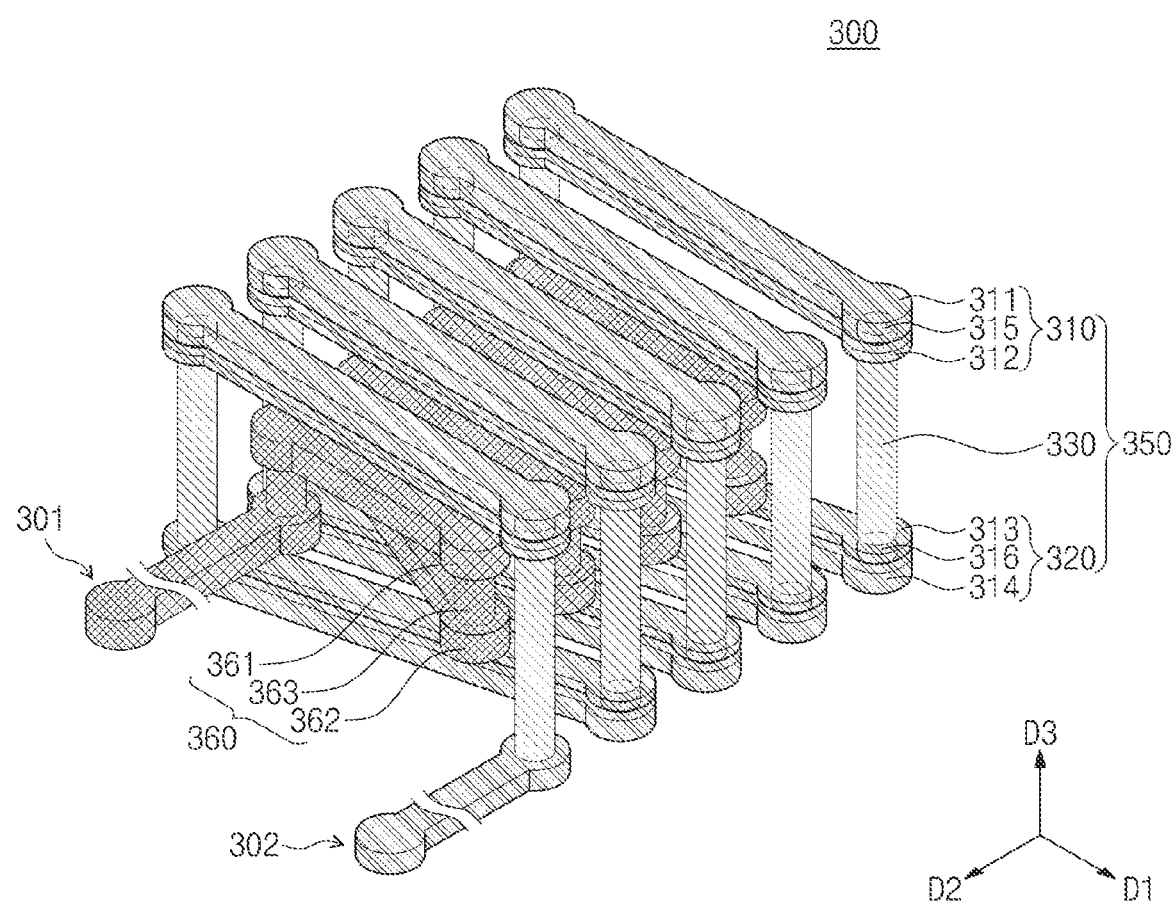
FIG. 4 illustrates a perspective view showing an inductor structure according to some exemplary embodiments of the present disclosure.
Figure 5:
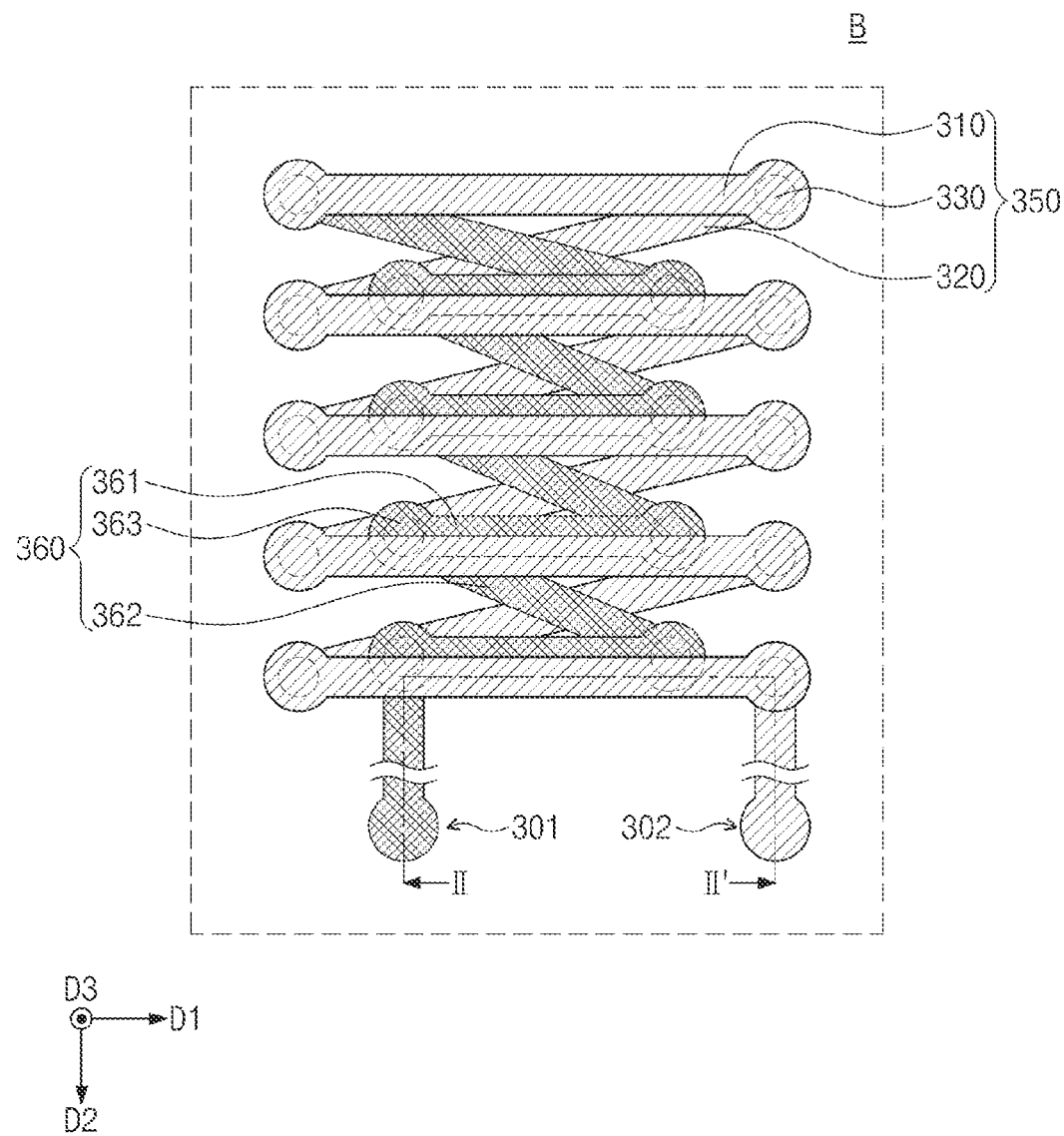
FIG. 5 illustrates an enlarged plan view showing section B of FIG. 1.
Figure 6A:
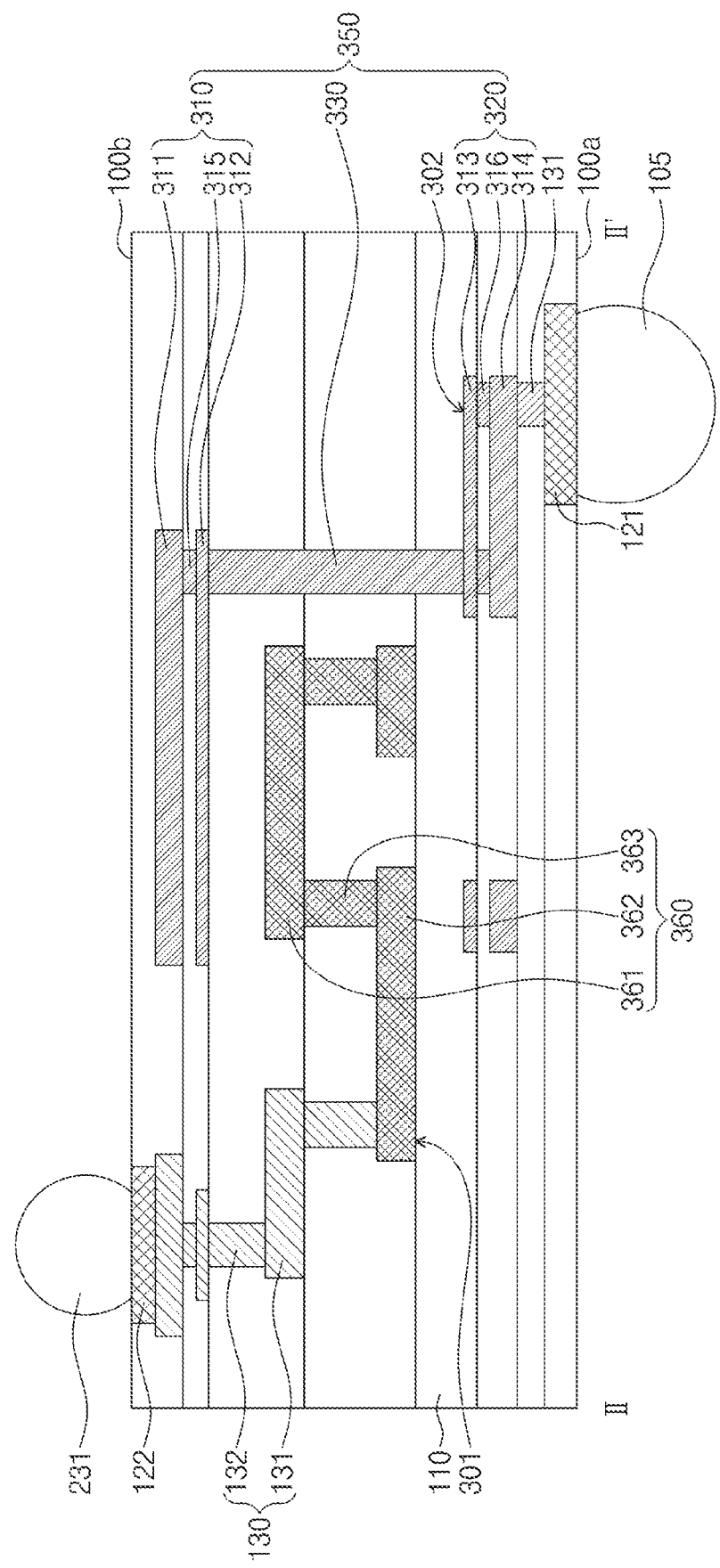
FIGS. 6A and 6B illustrate cross-sectional views taken along line II-II' of FIG. 5, partially showing a semiconductor package according to some exemplary embodiments of the present disclosure.
Figure 6B:
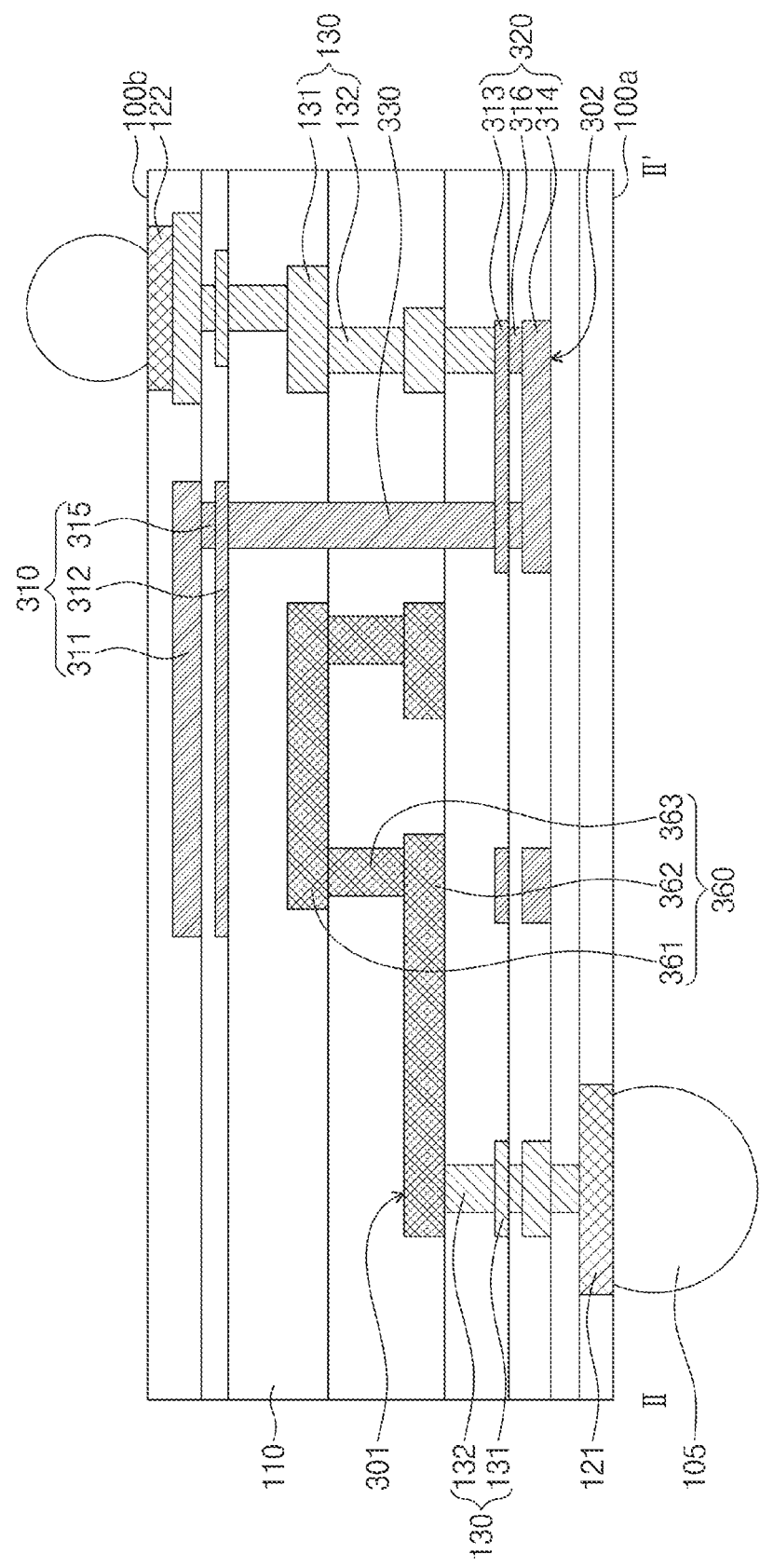

FIG. 3 illustrates an enlarged cross-sectional view showing section A of FIG. 2. FIG. 4 illustrates a perspective view showing an inductor structure according to some exemplary embodiments of the present disclosure. FIG. 5 illustrates an enlarged plan view showing section B of FIG. 1. FIGS. 6A and 6B illustrate cross-sectional views taken along line II-II' of FIG. 5, partially showing a semiconductor package according to some exemplary embodiments of the present disclosure.

Referring to FIGS. 1 to 5, an inductor structure 300 may be provided in the redistribution substrate 100. The inductor structure 300 may be positioned between the first surface 100a and the second surface 100b of the redistribution substrate 100. For example, the inductor structure 300 may be positioned in the dielectric patterns 110. The semiconductor package may operate with a voltage provided from a voltage generating circuit included in an external device. The inductor structure 300 may be electrically connected to the external bonding terminal 105 and the semiconductor chip 200, and may provide an electrical path for the voltage between the voltage generating circuit and the semiconductor chip 200. The inductor structure 300 may adjust the voltage and may provide an adjusted voltage to an internal circuit of the semiconductor chip 200.

The inductor structure 300 may include an inner coil pattern 360 and an outer coil pattern 350 that surrounds the inner coil pattern 360. The inner coil pattern 360 and the outer coil pattern 350 may generate a magnetic field in response to an electrical signal applied to the inductor structure 300. As shown in FIGS. 4 and 5, the inductor structure 300 may include a first terminal 301 connected to the inner coil pattern 360 and a second terminal 302 connected to the outer coil pattern 350. The inner coil pattern 360 and the outer coil pattern 350 may be electrically connected to each other, and in response to an electrical signal that passes through between the first terminal 301 and the second terminal 302, may generate a magnetic field inside the inductor structure 300. Each of magnetic fields generated from the inner coil pattern 360 and the outer coil pattern 350 may have a direction parallel to the second direction D2.

The inner coil pattern 360 and the outer coil pattern 350 may be configured to generate magnetic fields having the same direction in response to an electrical signal that passes through between the first terminal 301 and the second terminal 302. According to some exemplary embodiments, the inner coil pattern 360 and the outer coil pattern 350 may each have a coil shape and may have different winding directions from each other. A magnetic field generated from the inner coil pattern 360 and a magnetic field generated from the outer coil pattern 350 may overlap each other to increase inductance and a Q factor of the inductor structure 300.

For example, the outer coil pattern 350 may include outer vertical parts 330 and outer horizontal parts 310 and 320 that connect the outer vertical parts 330 to each other. The outer vertical parts 330 and the outer horizontal parts 310 and 320 may be connected to have a counterclockwise wound coil shape. The outer horizontal parts 310 and 320 may include first outer horizontal parts 310 and second outer horizontal parts 320 that are spaced apart from each other in the third direction D3.

The outer vertical parts 330 may be arranged in the first direction D1 and the second direction D2. The outer vertical parts 330 may be provided between the first outer horizontal parts 310 and the second outer horizontal parts 320. The outer vertical parts 330 may penetrate a plurality of dielectric patterns 110 to electrically connect the first outer horizontal parts 310 to the second outer horizontal parts 320. According to some exemplary embodiments, the outer vertical parts 330 may each have a pillar shape that extends in the third direction D3. However, shapes of the outer vertical parts 330 are not limited thereto, and may be changed to increase inductance of the inductor structure 300 and to achieve an easier fabrication of the redistribution substrate 100. A length in the third direction D3 of each of the outer vertical parts 330 may be greater than a distance between top and bottom surfaces of the inner coil pattern 360. For example, top ends of the outer vertical parts 330 may be located at a higher level than that of the top surface of the inner coil pattern 360, and bottom ends of the outer vertical parts 330 may be located at a lower level than that of the bottom surface of the inner coil pattern 360.

The first outer horizontal parts 310 may be provided on the top ends of the outer vertical parts 330. The first outer horizontal parts 310 may be positioned adjacent to the second surface 100b of the redistribution substrate 100. The first outer horizontal parts 310 may extend parallel to the first direction D1. The first outer horizontal parts 310 may be arranged in the second direction D2. The first outer horizontal parts 310 may have their distal ends rounded and that vertically overlap the outer vertical parts 330. Each of the first outer horizontal parts 310 may connect to each other two outer vertical parts 330 that are spaced apart from each other in the first direction D1.

The first outer horizontal parts 310 may each include a first conductive layer 311, a second conductive layer 312, and a first connection pattern 315. The first conductive layer 311 may be provided in the uppermost dielectric pattern 110. The second conductive layer 312 may be positioned between the first conductive layer 311 and the inner coil pattern 360. The first conductive layer 311 and the second conductive layer 312 may extend parallel to each other in the first direction D1 and may vertically overlap each other. The first connection pattern 315 may be positioned between a top surface of the second conductive layer 312 and a bottom surface of the first conductive layer 311. The first connection pattern 315 may electrically connect the first conductive layer 311 to the second conductive layer 312. The first connection pattern 315 may at least partially vertically overlap the outer vertical part 330.

The second outer horizontal parts 320 may be provided on the bottom ends of the outer vertical parts 330. The second outer horizontal parts 320 may be positioned adjacent to the first surface 100a of the redistribution substrate 100. The second outer horizontal parts 320 may be parallel to the second surface 100b of the redistribution substrate 100 and may extend in a direction that intersects the first and second directions D1 and D2. The second outer horizontal parts 320 may have rounded distal ends that vertically overlap the outer vertical parts 330. The distal ends of the second outer horizontal parts 320 may be connected through the outer vertical parts 330 to the distal ends of the first outer horizontal parts 310. For example, as shown in FIG. 5, each of the second outer horizontal parts 320 may vertical overlap two first outer horizontal parts 310 that are spaced apart from each other in the second direction D2. One second outer horizontal part 320 may use the outer vertical parts 330 to connect to each other two first outer horizontal parts 310 that are spaced apart from each other in the second direction D2. In addition, two second outer horizontal parts 320, which are spaced apart from each other in the second direction D2, may be connected through the outer vertical parts 330 to one first outer horizontal part 310.

The second outer horizontal parts 320 may each include a third conductive layer 313, a fourth conductive layer 314, and a second connection pattern 316. The third conductive layer 313 may be positioned between the fourth conductive layer 314 and the inner coil pattern 360. The third conductive layer 313 and the fourth conductive layer 314 may extend parallel to each other and may vertically overlap each other. The second connection pattern 316 may be positioned between a top surface of the fourth conductive layer 314 and a bottom surface of the third conductive layer 313. The second connection pattern 316 may electrically connect the third conductive layer 313 to the fourth conductive layer 314. The second connection pattern 316 may at least partially vertically overlap the outer vertical part 330.

The inner coil pattern 360 may be provided between the outer vertical parts 330 and between the outer horizontal parts 310 and 320. The inner coil pattern 360 may at least partially vertically overlap the first outer horizontal part 310 and the second outer horizontal part 320. The inner coil pattern 360 may include inner horizontal parts 361 and 362 and inner vertical parts 363. The inner horizontal parts 361 and 362 and the inner vertical parts 363 may be connected to have a counterclockwise wound coil shape.

The inner horizontal parts 361 and 362 may include first inner horizontal parts 361 and second inner horizontal parts 362. The first inner horizontal parts 361 may be spaced apart in the third direction D3 from the second inner horizontal parts 362. The first inner horizontal parts 361 may extend in a direction parallel to the first outer horizontal parts 310. The first inner horizontal parts 361 may be arranged in the second direction D2. The first inner horizontal parts 361 may have rounded distal ends that vertically overlap the inner vertical parts 363. Each of the first inner horizontal parts 361 may connect to each other inner vertical parts 363 that are spaced apart from each other in the first direction D1.

The second inner horizontal parts 362 may extend in a direction that intersects the first and second directions D1 and D2. As shown in FIG. 5, the second inner horizontal parts 362 may intersect the second outer horizontal parts 320. The second inner horizontal parts 362 may have distal ends. The distal ends of the second inner horizontal parts 362 may be connected through the inner vertical parts 363 to the distal ends of the first inner horizontal parts 361. For example, as shown in FIG. 5, each of the second inner horizontal parts 362 may vertically overlap two first inner horizontal parts 361 that are spaced apart from each other in the second direction D2. One second inner horizontal part 362 may use the inner vertical parts 363 to connect to each other two first inner horizontal parts 361 that are spaced apart from each other in the second direction D2. In addition, two second inner horizontal parts 362, which are spaced apart from each other in the second direction D2, may be connected through the inner vertical parts 363 to one first inner horizontal part 361.

The inner vertical parts 363 may be provided between the first inner horizontal parts 361 and the second inner horizontal parts 362. The inner vertical parts 363 may be arranged in the first and second directions D1 and D2. The inner vertical parts 363 may electrically connect the first inner horizontal parts 361 to the second inner horizontal parts 362. According to some exemplary embodiments, the inner vertical parts 363 may each have a pillar shape that extends in the third direction D3. A length in the third direction D3 of each of the inner vertical parts 363 may be less than the length in the third direction D3 of each of the outer vertical parts 330.

Referring back to FIG. 3, as the outer horizontal parts 310 and 320 include a plurality of conductive layers 311, 312, 313, and 314, it may be possible to reduce AC (alternating current) loss due to the proximity effect and skin effect between the inner coil pattern 360 and the outer coil pattern 350. The plurality of conductive layers 311, 312, 313, and 314 and the outer horizontal parts 310 and 320 may have different thicknesses in order to reduce AC loss while minimizing an increase in resistance of the outer horizontal parts 310 and 320.

For example, the first conductive layer 311 may have a thickness t1 greater than a thickness t2 of the second conductive layer 312. The thickness t2 of the second conductive layer 312 may have a value ranging from about 0.4 times to about 0.6 times the thickness t1 of the first conductive layer 311. The first connection pattern 315 may have a thickness less than the thickness t1 of the first conductive layer 311 and the same as or less than the thickness t2 of the second conductive layer 312. For example, a distance d1 between the first conductive layer 311 and the second conductive layer 312 may be less than the thickness t1 of the first conductive layer 311 and the same as or less than the thickness t2 of the second conductive layer 312. The distance d1 between the first conductive layer 311 and the second conductive layer 312 may have a value ranging from about 0.2 times to about 0.5 times the thickness t1 of the first conductive layer 311. The d1 between the first conductive layer 311 and the second conductive layer 312 may have a value ranging from about 0.5 times to about 1 time the thickness t2 of the second conductive layer 312.

The fourth conductive layer 314 may have a thickness t3 greater than a thickness t4 of the third conductive layer 313. The thickness t4 of the third conductive layer 313 may have a value ranging from about 0.4 times to about 0.6 times the thickness t3 of the fourth conductive layer 314. The second connection pattern 316 may have a thickness less than the thickness t3 of the fourth conductive layer 314 and the same as or less than the thickness t4 of the third conductive layer 313. A distance d2 between the fourth conductive layer 314 and the third conductive layer 313 may have a value ranging from about 0.2 times to about 0.5 times the thickness t3 of the fourth conductive layer 314. The distance d2 between the fourth conductive layer 314 and the third conductive layer 313 may have a value ranging from about 0.5 times to about 1 time the thickness t4 of the third conductive layer 313.

According to exemplary some embodiments, the thickness t1 of the first conductive layer 311 may be the same as the thickness t3 of the fourth conductive layer 314. The thickness t2 of the second conductive layer 312 may be the same as the thickness t4 of the third conductive layer 313. The distance d1 between the first conductive layer 311 and the second conductive layer 312 may be the same as the distance d2 between the third conductive layer 313 and the fourth conductive layer 314.

Among the first, second, third, and fourth conductive layers 311, 312, 313, and 314, the second and third conductive layers 312 and 313 adjacent to the inner coil pattern 360 may have thicknesses less than those of the first and fourth conductive layers 311 and 314, which may result in a reduction in AC loss.

The inner horizontal parts 361 and 362 may each have a thickness t5 greater than that of each of the first, second, third, and fourth conductive layers 311, 312, 313, and 314. According to some exemplary embodiments, the thickness t5 of each of the inner horizontal parts 361 and 362 may be the same as a sum of the thickness t1 of the first conductive layer 311 and the thickness t2 of the second conductive layer 312 or a sum of the thickness t4 of the third conductive layer 313 and the thickness t3 of the fourth conductive layer 314. The thickness t5 of each of the inner horizontal parts 361 and 362 may be less than a distance between a top surface of the first conductive layer 311 and a bottom surface of the second conductive layer 312 or a distance between a top surface of the third conductive layer 313 and a bottom surface of the fourth conductive layer 314.

A length in the first direction D1 of each of the inner horizontal parts 361 and 362 may be less than a length in the first direction D1 of each of the outer horizontal parts 310 and 320. The length in the first direction D1 of each of the inner horizontal parts 361 and 362 may have a value ranging from about 0.4 times to about 0.8 times the length in the first direction D1 of each of the outer horizontal parts 310 and 320.

Referring to FIGS. 5 and 6B, the inductor structure 300 may be electrically connected through the redistribution patterns 130 to the first pad 121 and the second pad 122. The inner coil pattern 360 may be electrically connected through the first terminal 301 to one of the first pad 121 and the second pad 122. The outer coil pattern 350 may be electrically connected through the second terminal 302 to the other of the first pad 121 and the second pad 122. According to some exemplary embodiments, the first terminal 301 may be a portion of the second inner horizontal part 362. In addition, the second terminal 302 may be a portion of the second outer horizontal part 320.

According to some exemplary embodiments, as shown in FIG. 6A, the inner coil pattern 360 may be electrically connected through the redistribution patterns 130 to the second pad 122. The redistribution patterns 130 may electrically connect the first terminal 301 to the second pad 122. The outer coil pattern 350 may be electrically connected through the via part 131 to the first pad 121. The via part 131 may electrically connect the second terminal 302 to the first pad 121.

According to some exemplary embodiments, as shown in FIG. 6B, the inner coil pattern 360 may be electrically connected through the redistribution patterns 130 to the first pad 121. The redistribution patterns 130 may electrically connect the first terminal 301 to the first pad 121. The outer coil pattern 350 may be electrically connected through the redistribution patterns 130 to the second pad 122. The redistribution patterns 130 may electrically connect the second terminal 302 to the second pad 122.

Figure 7:
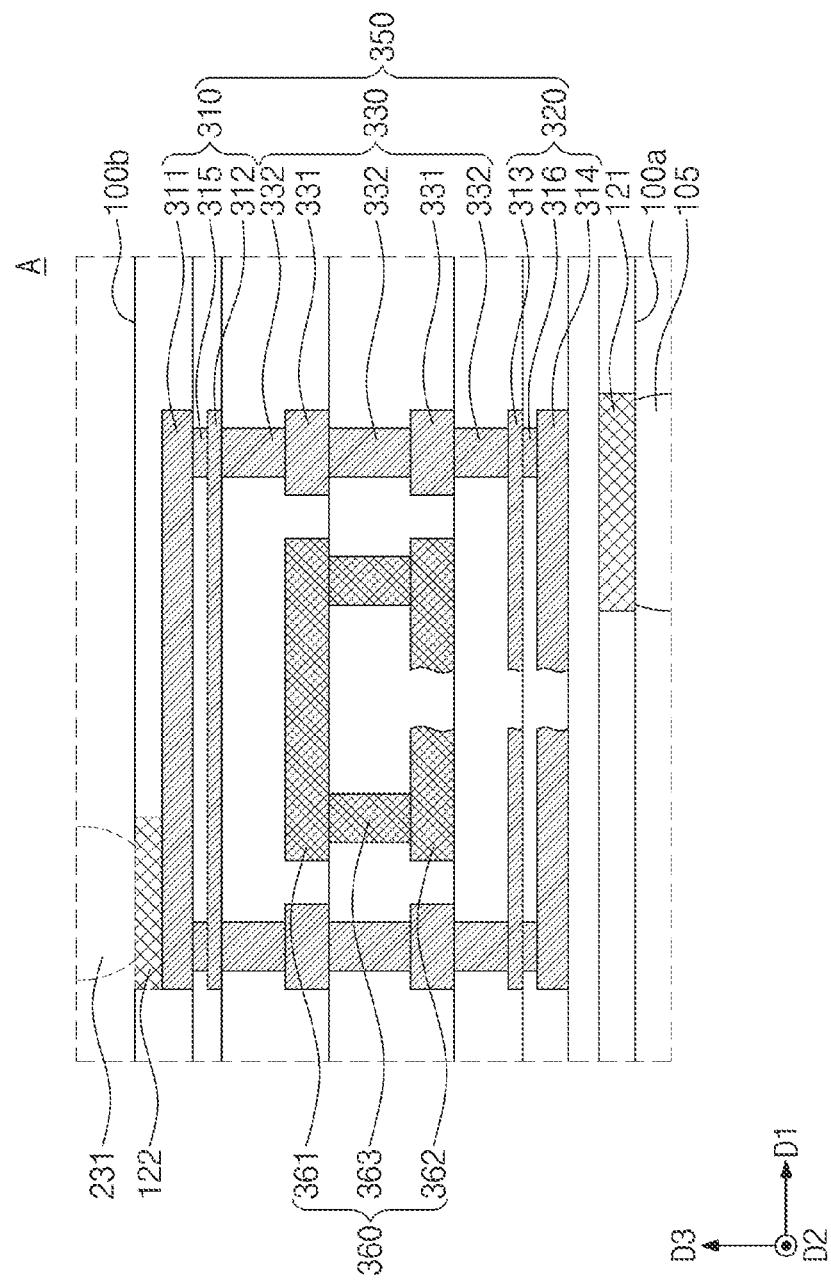
FIGS. 7 to 9 illustrate enlarged cross-sectional views showing section A of a semiconductor package according to some exemplary embodiments of the present disclosure.
Figure 8:
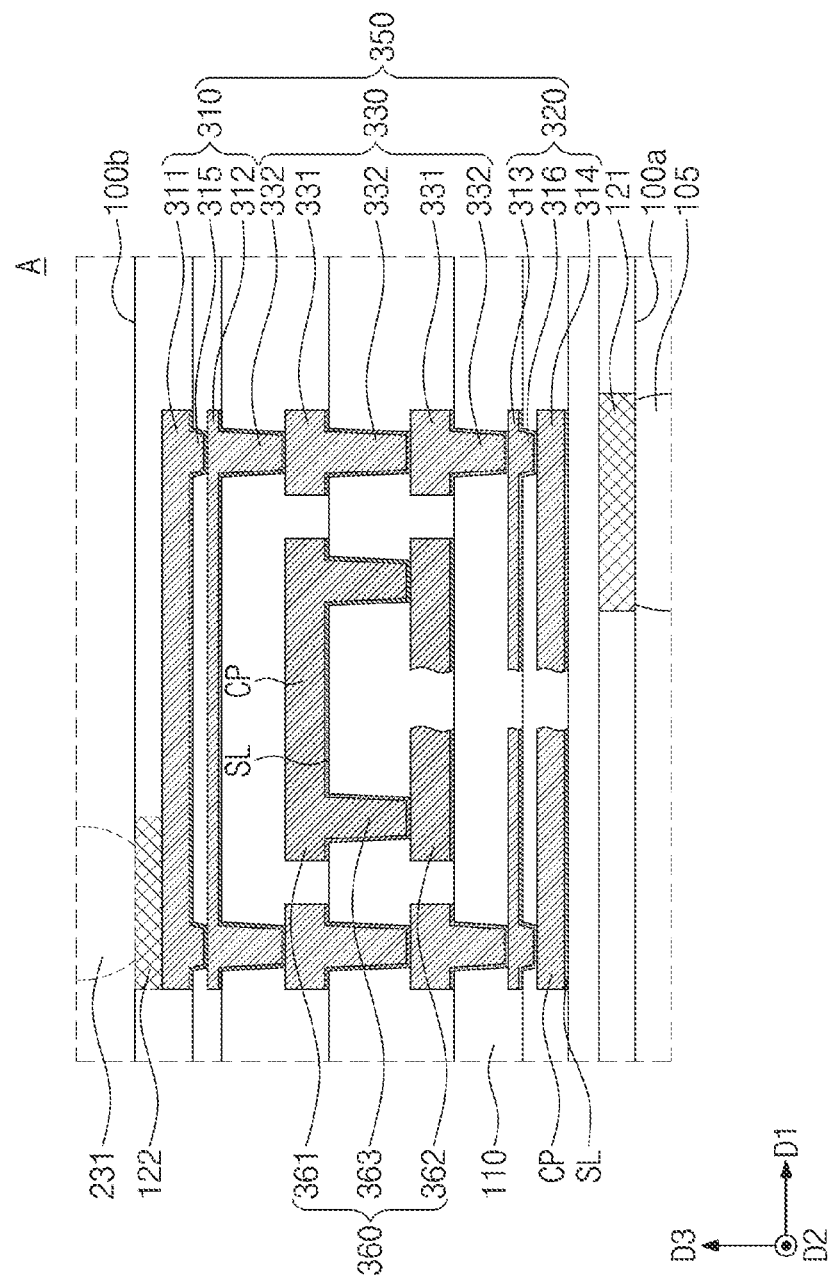
Figure 9:
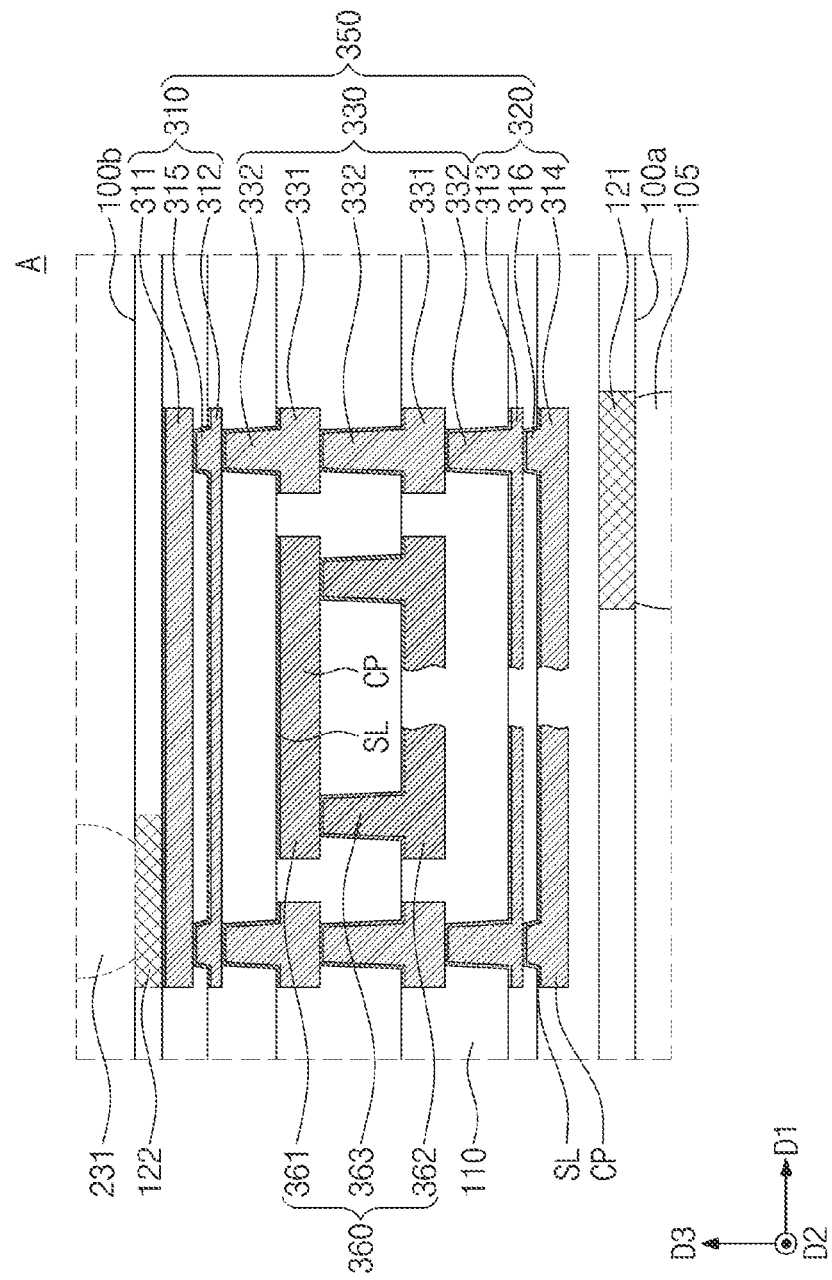

FIGS. 7 to 9 illustrate enlarged cross-sectional views showing section A of a semiconductor package according to some exemplary embodiments of the present disclosure.

Referring to FIG. 7, the outer vertical parts 330 of the outer coil pattern 350 may each have a multi-layered structure. For example, the outer vertical parts 330 may include pad parts 331 that are correspondingly disposed on the top surfaces of the dielectric patterns 110 and via parts 332 that are connected to the pad parts 331. The pad parts 331 may each have a width greater than that of each of the via parts 332. The pad parts 331 may each have a thickness the same as that of each of the inner horizontal parts 361 and 362 each of which is located at the same level as that of a corresponding one of the pad parts 331. The via part 332 between the pad parts 331 may have a length in the third direction D3 the same as that of each of the inner vertical parts 363. The pad parts 331 may be electrically connected through the via parts 332 to the first outer horizontal parts 310 and the second outer horizontal parts 320.

Referring to FIGS. 3 and 8, the outer coil pattern 350 and the inner coil pattern 360 may include seed layers SL and conductive patterns CP. The seed layers SL may cover portions of the top surfaces of the dielectric patterns 110 and at least portions of inner surfaces of holes that penetrate the dielectric patterns 110. The seed layers SL may include at least one selected from titanium and tantalum.

The conductive patterns CP may be formed on top surfaces of the seed layers SL. The conductive patterns CP may be formed by performing an electroplating process in which the seed layers SL are used as electrodes. The conductive patterns CP may include metal, such as copper. According to some exemplary embodiments, the inductor structure 300 may be formed simultaneously with the redistribution patterns 130 when the redistribution substrate 100 is formed. According to some exemplary embodiments, the semiconductor package may be fabricated by a chip-last process.

According to some exemplary embodiments, one seed layer SL may be used to simultaneously form the above-described components of the inductor structure 300 that are discussed above. Two components formed by one seed layer SL may be connected into a single unitary piece, and no interface may be present between the two components. The one seed layer SL may conformally cover the bottom surface of the two connected components. The first conductive layer 311 and the first connection pattern 315 may be formed at the same time from one seed layer SL. The third conductive layer 313 and the second connection pattern 316 may be formed at the same time from one seed layer SL. The pad parts 331 and their underlying via parts 332 may be formed at the same time from one seed layer SL. The first inner horizontal parts 361 and the inner vertical parts 363 may be formed at the same time from one seed layer SL.

Referring to FIGS. 3 and 9, the seed layers SL may cover portions of the bottom surfaces of the dielectric patterns 110 and at least portions of inner walls of holes that penetrate the dielectric patterns 110. The conductive patterns CP may be formed on bottom surfaces of the seed layers SL. Alternatively from that shown, the semiconductor package may be fabricated by a chip-first process.

According to some exemplary embodiments, the second conductive layer 312 and the first connection pattern 315 may be formed at the same time from one seed layer SL positioned thereon. The fourth conductive layer 314 and the second connection pattern 316 may be formed at the same time from one seed layer SL. The pad parts 331 and their underlying via parts 332 may be formed at the same time from one seed layer SL. The second inner horizontal parts 362 and the inner vertical parts 363 may be formed at the same time from one seed layer SL.

Figure 10A:
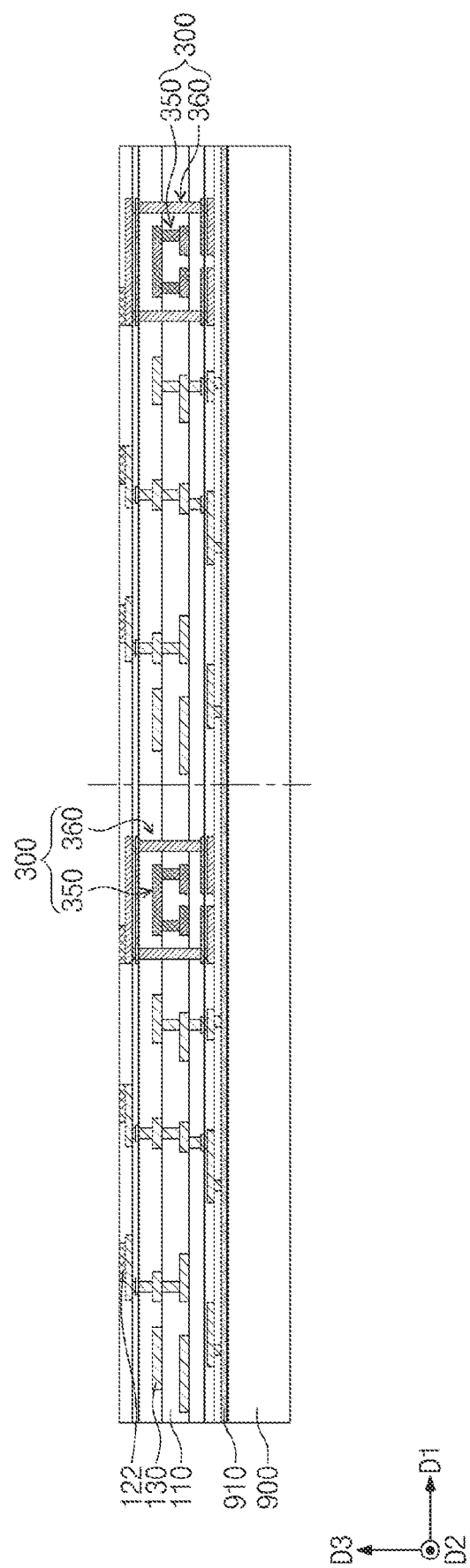
FIGS. 10A to 10C illustrate cross-sectional views showing a method of fabricating a semiconductor package according to some exemplary embodiments of the present disclosure.
Figure 10B:
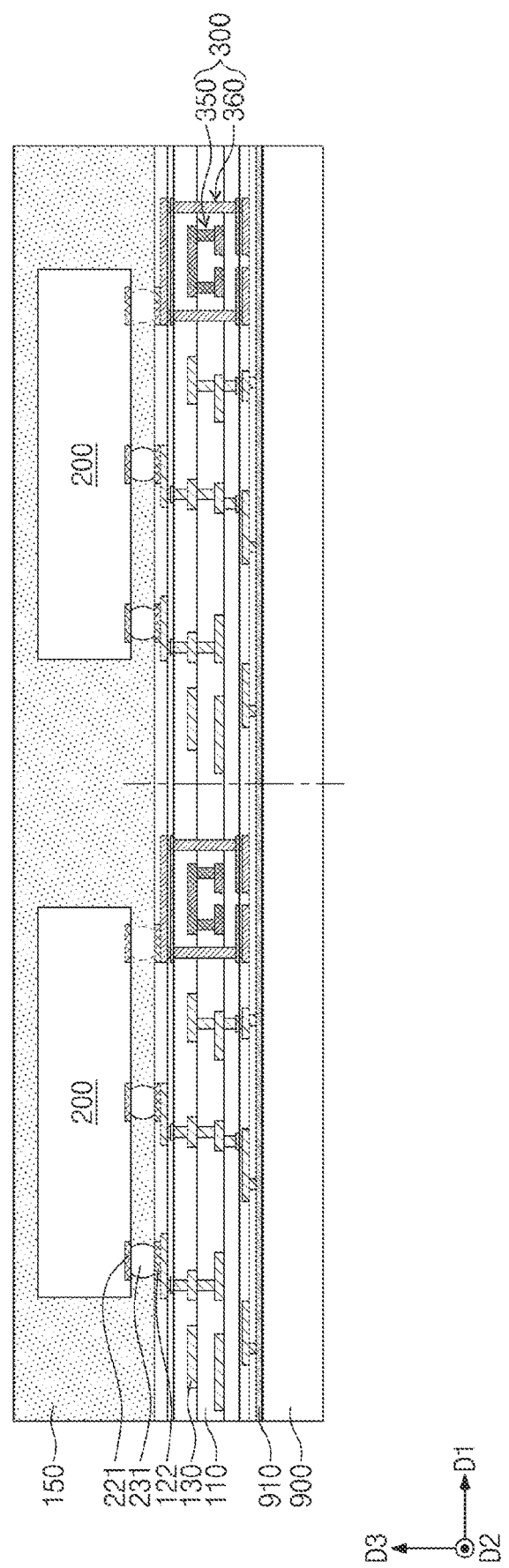
Figure 10C:
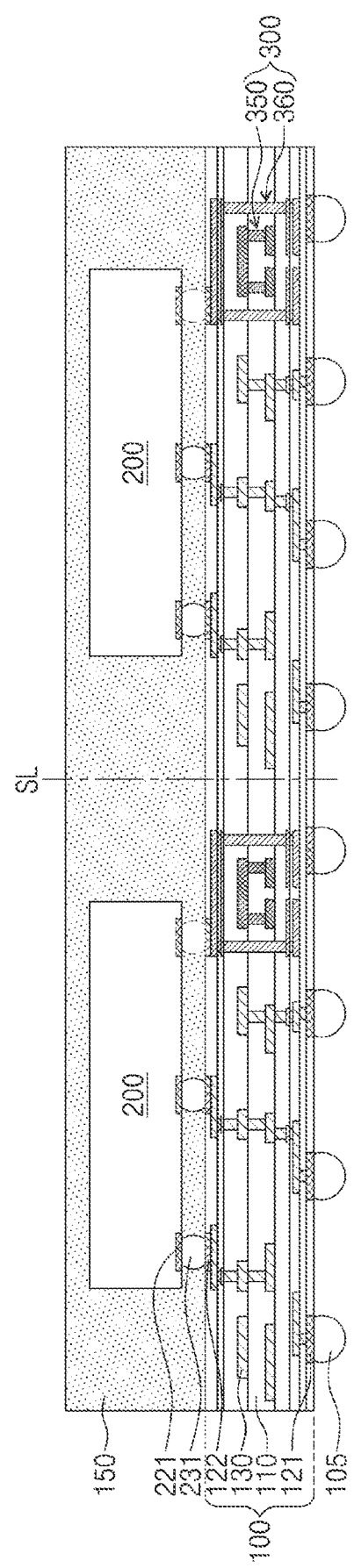

FIGS. 10A to 10C illustrate cross-sectional views showing a method of fabricating a semiconductor package according to some exemplary embodiments of the present disclosure.

Referring to FIG. 10A, a dielectric layer may be formed on a carrier substrate 900. A carrier adhesion layer 905 may further be interposed between the carrier substrate 900 and the dielectric layer. The carrier adhesion layer 905 may attach the dielectric layer to the carrier substrate 900. Herein, the phrase "a certain component is formed/provided on the carrier substrate 900" may mean that the carrier adhesion layer 905 is further interposed between the certain component and the carrier substrate 900. The phrase "the carrier substrate 900 is exposed" may mean that the carrier adhesion layer 905 is exposed. The formation of the dielectric layer may be performed by a coating process, such as spin coating or slit coating.

A patterning process may be performed in which the dielectric layer is patterned to form a dielectric pattern 110. The patterning process may be executed by exposure and development processes. The exposure process may be a negative tone exposure process or a positive tone exposure process. Afterwards, a curing process may be performed on the dielectric pattern 110. The dielectric pattern 110 may have openings that expose the carrier substrate 900.

A seed layer may be formed in the openings, and an electroplating process may be performed in which the seed layer is used as an electrode to form conductive patterns. The formation of the dielectric layer, the formation of the dielectric pattern 110, and the formation of the conductive patterns may be repeatedly performed to form dielectric patterns 110, a redistribution pattern 130, and an inductor structure 300. Thereafter, second pads 122 may be formed on a top surface of the redistribution pattern 130 and a top surface of the inductor structure 300.

Referring to FIG. 10B, a semiconductor chip 200 may be mounted on the dielectric patterns 110. The semiconductor chip 200 may include integrated circuits and chip pads 221 electrically connected to the integrated circuits. The chip pads 221 may be disposed to face the second pads 122. The chip pads 221 may be electrically connected through connection terminals 231 to the second pads 122. A molding layer 150 may be formed on the redistribution substrate 100. The molding layer 150 may cover the semiconductor chip 200 and may fill a space between the redistribution substrate 100 and the semiconductor chip 200. After that, the carrier substrate 900 may be removed.

Referring to FIG. 10C, first pads 121 may be formed on a bottom surface of the redistribution pattern 130. A plurality of external bonding terminals 105 may be formed on bottom surfaces of the first pads 121. Afterwards, the molding layer 150 and the redistribution substrate 100 may be diced along a scribe line SL to form a plurality of semiconductor packages that are separated from each other. According to some exemplary embodiments, the semiconductor packages may be fabricated at a chip, panel, or wafer level.

Figure 11:
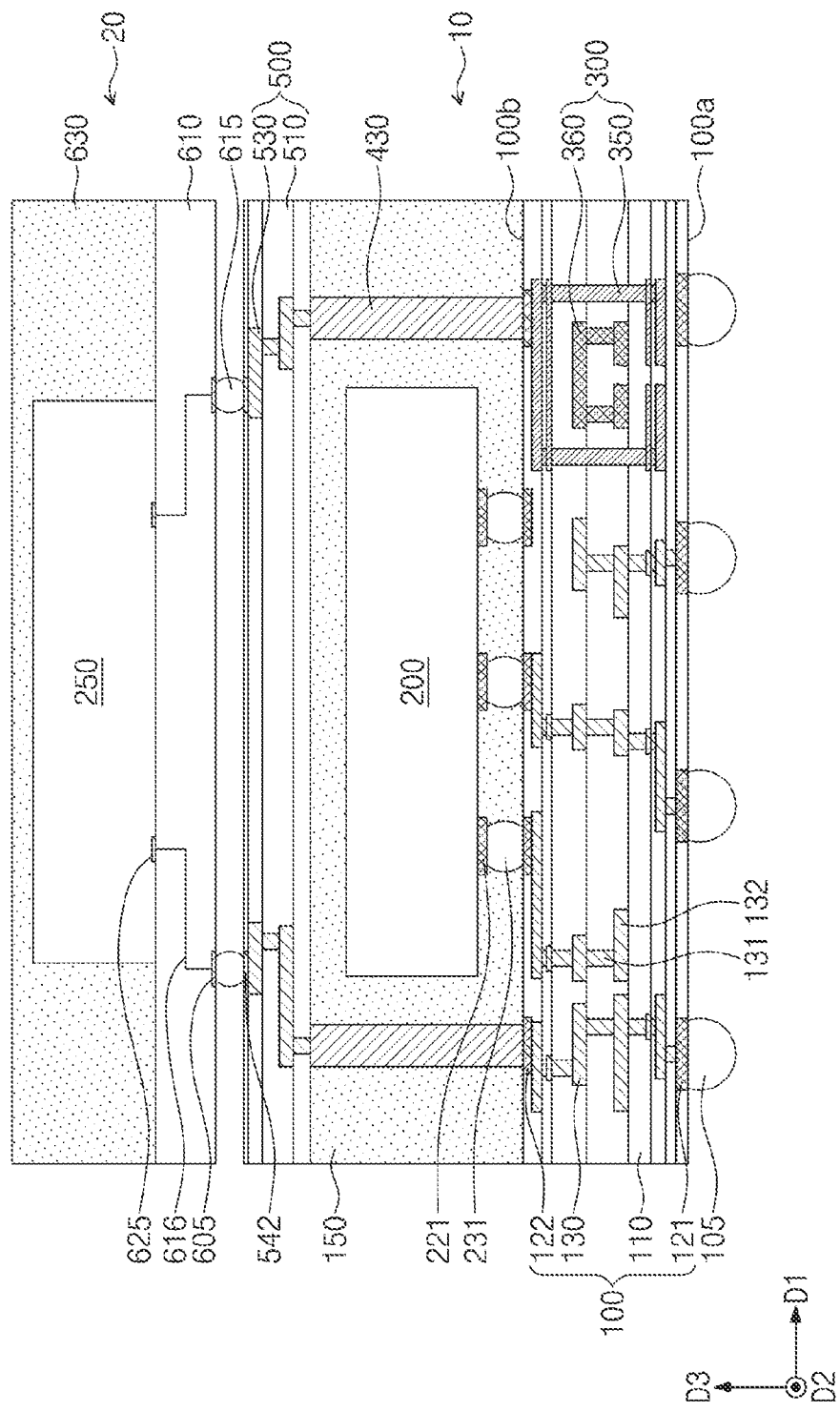
FIG. 11 illustrates a cross-sectional view showing a semiconductor package according to some exemplary embodiments of the present disclosure.

FIG. 11 illustrates a cross-sectional view showing a semiconductor package according to some exemplary embodiments of the present disclosure. Omission will be made to avoid a redundant detailed description of components that are the same as or similar to those discussed above.

Referring to FIG. 11, a semiconductor package may include a lower package 10 and an upper package 20. For example, the semiconductor package may be a package-on-package (POP) in which the upper package 20 is mounted on the lower package 10.

The lower package 10 may be similar to that discussed with reference to FIGS. 1 and 2. For example, the lower package 10 may include a redistribution substrate 100, a semiconductor chip 200, and a molding layer 150, and may further include conductive vias 350.

The redistribution substrate 100 may include dielectric patterns 110, redistribution patterns 130, and an inductor structure 300, which are similar to those discussed with reference to FIGS. 1 to 6B. A portion of the redistribution patterns 130 included in the redistribution substrate 100 may electrically connect the first pad 121 to the conductive via 430.

The conductive via 430 may be provided on the redistribution substrate 100. The conductive via 430 may be disposed laterally spaced apart from the semiconductor chip 200. The conductive via 430 may vertically penetrate the molding layer 150. The conductive via 430 may be electrically connected through the second pad 122 to the inductor structure 300.

The lower package 10 may further include an upper redistribution layer 500. The upper redistribution layer 500 may be disposed on a top surface of the molding layer 150 and a top surface of the conductive via 430. The upper redistribution layer 500 may include an upper dielectric pattern 510 and an upper redistribution pattern 530. The upper dielectric pattern 510 may include a photo-imagable polymer.

The upper package 20 may be mounted on the lower package 10. The upper package 20 may include an upper package substrate 610, an upper semiconductor chip 250, and an upper molding layer 630. The upper package substrate 610 may be, for example, a printed circuit board (PCB). Alternatively, the upper package substrate 610 may be a redistribution layer. A metal pad 605 may be disposed on a bottom surface of the upper package substrate 610.

The upper semiconductor chip 250 may be disposed on the upper package substrate 610. The upper semiconductor chip 250 may include integrated circuits, and the integrated circuits may include a memory circuit, a logic circuit, or a combination thereof. The upper semiconductor chip 250 may be of a different type from the semiconductor chip 200. The upper semiconductor chip 250 may include upper chip pads 625 each of which is electrically connected to a metal pad 605 through an internal line 616 in the upper package substrate 610. The internal line 616 is schematically illustrated in FIG. 11, and the internal line 616 may be variously modified in shape and arrangement.

The upper package substrate 610 may be provided thereon with the upper molding layer 630 that covers the upper semiconductor chip 250. The upper molding layer 630 may include a dielectric polymer, such as an epoxy-based polymer.

A conductive terminal 615 may be disposed between the lower package 10 and the upper package 20. The conductive terminal 615 may be interposed between and electrically connected to the upper pad 542 and the metal pad 605. Therefore, the upper package 20 may be electrically connected to the semiconductor chip 200 and the external bonding terminal 105 through the conductive terminal 615, the upper redistribution layer 500, and the conductive via 430.

An electrical connection of the upper package 20 may include an electrical connection with integrated circuits in the upper semiconductor chip 250. The presence of the upper redistribution layer 500 may allow the free design the internal line 616 in the upper package substrate 610 and integrated circuits in the upper semiconductor chip 250.

Figure 12:
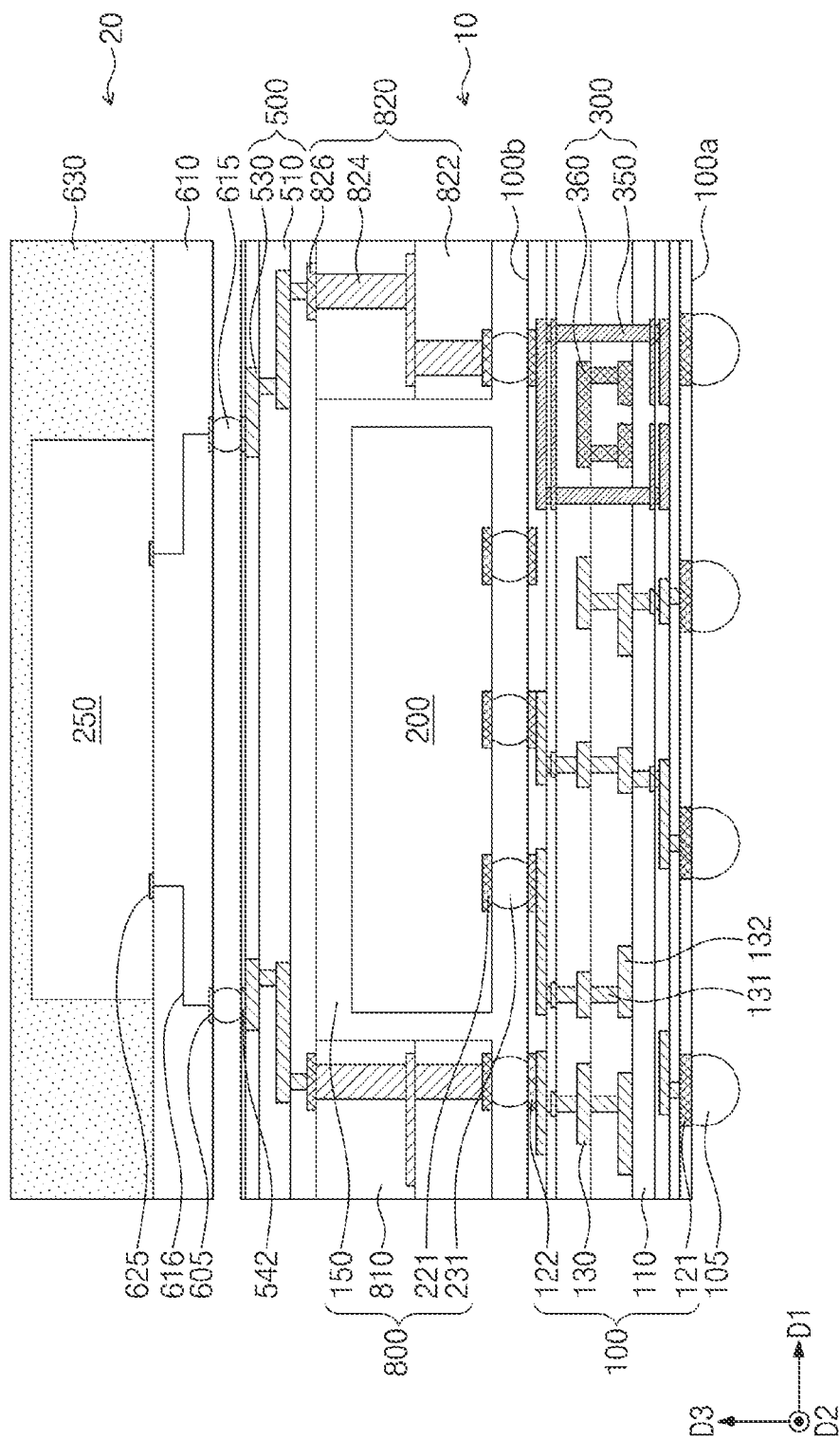
FIG. 12 illustrates a cross-sectional view showing a semiconductor package according to some exemplary embodiments of the present disclosure.

FIG. 12 illustrates a cross-sectional view showing a semiconductor package according to some exemplary embodiments of the present disclosure. Omission will be made to avoid a redundant detailed description of components that are same as or similar to those discussed above.

Referring to FIG. 12, a semiconductor package may include a lower package 10 and an upper package 20. For example, the semiconductor package may be a package-on-package (POP) in which the upper package 20 is mounted on the lower package 10.

Similarly, to that discussed with reference to FIGS. 1 to 6B, the lower package 10 may include a redistribution substrate 100, a semiconductor chip 200, and a molding layer 150. The lower package 10 may further include a connection substrate 800.

The connection substrate 800 may be disposed on the redistribution substrate 100. The connection substrate 800 may have an opening that penetrates therethrough. For example, the opening may have an open hole that connects top and bottom surfaces of the connection substrate 800. The bottom surface of the connection substrate 800 may be spaced apart from a top surface of the redistribution substrate 100. The connection substrate 800 may include a base layer 810 and a conductive member 820 that is a wiring pattern provided in the base layer 810. For example, the base layer 810 may include silicon oxide. The conductive member 820 may be disposed at an outer side of the connection substrate 800. The conductive member 820 may include lower pads 822, vias 824, and upper pads 826. The lower pads 822 may be disposed in a lower portion of the connection substrate 800. The vias 824 may penetrate the base layer 810 and may electrically connect the lower pads 822 to the upper pads 826.

The connection substrate 800 may be mounted on the redistribution substrate 100. For example, the connection substrate 800 may be connected to the second pad 122 of the redistribution substrate 100 through the connection terminals 231 provided on the lower pads 822. The connection substrate 800 may be electrically connected to the semiconductor chip 200 and the external bonding terminal 105.

The semiconductor chip 200 may be disposed on the redistribution substrate 100. The semiconductor chip 200 may be disposed in the opening of the connection substrate 800. The semiconductor chip 200 may be the same as or similar to that discussed with reference to FIGS. 1 to 6B. The molding layer 150 may fill a space between the semiconductor chip 200 and the connection substrate 800, a space between the semiconductor chip 200 and the redistribution substrate 100, and a space between the connection substrate 800 and the redistribution substrate 100.

A semiconductor package according to the present disclosure may include an inductor structure with reduced AC loss and high inductance. The inductor structure may be formed in a redistribution substrate, and thus there may be an increase in power efficiency between the inductor structure and a semiconductor chip. Accordingly, it may be possible to provide a redistribution substrate with increased reliability and improved electrical properties and a semiconductor package including the redistribution substrate.

This detailed description of the present disclosure should not be construed as limited to the exemplary embodiments set forth herein, and it is intended that the present disclosure cover the various combinations, the modifications and variations of this invention without departing from the spirit and scope of the following claims.

What is claimed is:

1. A semiconductor package, comprising:
a redistribution substrate;
a semiconductor chip mounted on the redistribution substrate; and
an inductor structure in the redistribution substrate and electrically connected to the semiconductor chip,
wherein the inductor structure includes:
an outer coil pattern that includes a plurality of vertical parts extending in a vertical direction and an outer horizontal part extending in a horizontal direction and connecting the plurality of vertical parts to each other; and
an inner coil pattern between the vertical parts and electrically connected to the outer coil pattern,
wherein the outer horizontal part overlaps the inner coil pattern in the vertical direction and includes:
a first conductive layer; and
a second conductive layer between the first conductive layer and the inner coil pattern,
wherein the first conductive layer and the second conductive layer are electrically interconnected by a connection pattern contacting a top surface of the second conductive layer and a bottom surface of the first conductive layer,
wherein the connection pattern is spaced apart from the inner coil pattern in the horizontal direction to not overlap the inner coil pattern in the vertical direction, and
wherein the second conductive layer has a thickness that is less than a thickness of the first conductive layer.

2. The semiconductor package of claim 1, wherein the thickness of the first conductive layer is greater than a distance between the first conductive layer and the second conductive layer.

3. The semiconductor package of claim 1, wherein the thickness of the second conductive layer has a range from 0.4 times to 0.6 times the thickness of the first conductive layer.

4. The semiconductor package of claim 1, wherein a distance between the first conductive layer and the second conductive layer has a range from 0.2 times to 0.5 times the thickness of the first conductive layer.

5. The semiconductor package of claim 1,
wherein the connection pattern at least partially overlaps at least one of the plurality of vertical parts.

6. The semiconductor package of claim 1, wherein the redistribution substrate includes:
a dielectric pattern;
a first pad on a first surface of the dielectric pattern;
a second pad on a second surface of the dielectric pattern; and
a redistribution pattern that connects the first pad to the second pad.

7. The semiconductor package of claim 1,
wherein the inner coil pattern includes an inner horizontal part that extends in the horizontal direction parallel to the outer horizontal part, and
wherein the inner horizontal part has a thickness greater than the thickness of the first conductive layer.

8. The semiconductor package of claim 1, wherein the inductor structure includes:
a first terminal connected to the outer coil pattern; and
a second terminal connected to the inner coil pattern.

9. The semiconductor package of claim 1, wherein the outer coil pattern includes:
a third conductive layer that at least partially overlaps the outer horizontal part; and
a fourth conductive layer between the third conductive layer and the inner coil pattern,
wherein the fourth conductive layer has a thickness that is less than a thickness of the third conductive layer.

10. The semiconductor package of claim 1, wherein the redistribution substrate includes:
a first pad on a first surface of the redistribution substrate; and
a second pad on a second surface of the redistribution substrate,
wherein the inductor structure is electrically connected to the first pad and the second pad.

11. A semiconductor package, comprising:
a redistribution substrate;
a semiconductor chip mounted on the redistribution substrate; and
an inductor structure in the redistribution substrate and electrically connected to the semiconductor chip,
wherein the inductor structure includes:
an inner coil pattern; and
an outer coil pattern that surrounds the inner coil pattern in at least one of a horizontal direction and a vertical direction,
wherein the outer coil pattern includes:

a first conductive layer; and
a second conductive layer between the first conductive layer and the inner coil pattern,
wherein the first conductive layer and the second conductive layer are electrically interconnected by a connection pattern contacting a top surface of the second conductive layer and a bottom surface of the first conductive layer,
wherein the connection pattern is spaced apart from the inner coil pattern in the horizontal direction to not overlap the inner coil pattern in the vertical direction, and
wherein a distance between the first conductive layer and the second conductive layer is less than a thickness of the first conductive layer.

12. The semiconductor package of claim 11, wherein the second conductive layer has a thickness that is less than the thickness of the first conductive layer.

13. The semiconductor package of claim 11,
wherein the connection pattern has a thickness that is less than the thickness of the first conductive layer.

14. The semiconductor package of claim 11, further comprising a plurality of vertical parts connected to the second conductive layer,
wherein the inner coil pattern is between the plurality of vertical parts.

15. The semiconductor package of claim 11, wherein the inductor structure includes:
a first terminal connected to the outer coil pattern; and
a second terminal connected to the inner coil pattern.

16. A redistribution substrate, comprising:
a dielectric pattern having a first surface and a second surface opposite to the first surface;
a first pad on the first surface;
a second pad on the second surface;
a redistribution pattern connecting the first pad to the second pad; and
an inductor structure between the first surface and the second surface, the inductor structure being electrically connected to at least one of the first pad and the second pad,
wherein the inductor structure includes:
an inner coil pattern comprising a plurality of inner horizontal parts extending in a horizontal direction and a plurality of inner vertical parts extending in a vertical direction and connecting the plurality of inner horizontal parts to each other; and
an outer coil pattern surrounding the inner coil pattern, the outer coil pattern comprising a plurality of outer horizontal parts and a plurality of outer vertical parts connecting the plurality of outer horizontal parts to each other,
wherein each of the plurality of outer horizontal parts includes:
a first conductive layer; and
a second conductive layer that has a thickness that is less than a thickness of the first conductive layer,
wherein the first conductive layer and the second conductive layer are electrically interconnected by a connection pattern contacting a top surface of the second conductive layer and a bottom surface of the first conductive layer, and
wherein the connection pattern is spaced apart from the inner coil pattern in the horizontal direction to not overlap the inner coil pattern in the vertical direction.

17. The redistribution substrate of claim 16, wherein the second conductive layer is between the first conductive layer and the inner coil pattern.

18. The redistribution substrate of claim 16, wherein a distance between the first conductive layer and the second conductive layer is less than the thickness of the first conductive layer.

19. The redistribution substrate of claim 16, wherein the inductor structure includes:
a first terminal connected to the outer coil pattern; and
a second terminal connected to the inner coil pattern.

20. The redistribution substrate of claim 16, wherein the inductor structure is between a bottom surface of the first pad and a top surface of the second pad.

* * * * *